(12) United States Patent
Islam et al.

(10) Patent No.: US 7,262,491 B2
(45) Date of Patent: Aug. 28, 2007

(54) DIE PAD FOR SEMICONDUCTOR PACKAGES AND METHODS OF MAKING AND USING SAME

(75) Inventors: Shafidul Islam, Plano, TX (US); Romarico Santos San Antonio, Batam Island (ID); Anang Subagio, Batam Island (ID)

(73) Assignee: Advanced Interconnect Technologies Limited, Port Louis (MU)

( * ) Notice: Subject to any disclaimer, the term of this patent is extended or adjusted under 35 U.S.C. 154(b) by 49 days.

(21) Appl. No.: 11/220,761

(22) Filed: Sep. 6, 2005

(65) Prior Publication Data

US 2007/0052070 A1 Mar. 8, 2007

(51) Int. Cl.
*H01L 23/495* (2006.01)
*H01L 29/06* (2006.01)

(52) U.S. Cl. .................. 257/670; 257/622; 257/666; 257/676; 257/787; 257/E23.001; 257/E23.18; 257/E23.19; 257/E23.037; 257/E23.067

(58) Field of Classification Search .............. 257/276, 257/625, 618, 622, 666–677, 706, 707, 712–722, 257/778–786, 787, 796, E23.031, E23.059, 257/E23.004, E23.043
See application file for complete search history.

(56) References Cited

U.S. PATENT DOCUMENTS 4,888,449 A    12/1989  Crane et al. ............... 174/52.4
5,701,034 A *  12/1997  Marrs ........................ 257/706
6,713,849 B2*   3/2004  Hasebe et al. ............. 257/667
6,777,788 B1*   8/2004  Wan et al. .................. 257/670
2004/0169271 A1* 9/2004  Igarashi et al. ............ 257/709
2005/0167855 A1* 8/2005  Minamio et al. .......... 257/787
2006/0008947 A1* 1/2006  Yamaguchi ................ 438/114
2006/0108673 A1* 5/2006  Germain et al. ........... 257/678

* cited by examiner

*Primary Examiner*—Jasmine Clark
(74) *Attorney, Agent, or Firm*—Wiggin and Dana LLP; Gregory S. Rosenblatt

(57) ABSTRACT

A semiconductor device package comprising a semiconductor device and an electrically conductive lead frame at least partially covered by a molding compound. The electrically conductive lead frame includes a plurality of leads disposed proximate a perimeter of the package and a die pad disposed in a central region formed by the plurality of leads. The die pad includes a first die pad surface disposed at the first package face, and a second die pad surface opposite the first die pad surface. The semiconductor device is attached to a central region of the second die pad surface, and a portion of the second die pad surface extending outward from the die is roughened to improve adhesion of the die pad to the molding compound. In other aspects, grooves are disposed in the first and/or second die pad surfaces to further promote adhesion of the die pad and to prevent moisture from permeating into the vicinity of the semiconductor chip. The die pad may further include tie bars extending therefrom, and at least one lip at may extend from a side surface of the die pad to anchor the die pad in the molding compound. The die pad may also include apertures disposed therein for allowing the egress of moisture from the package.

18 Claims, 10 Drawing Sheets

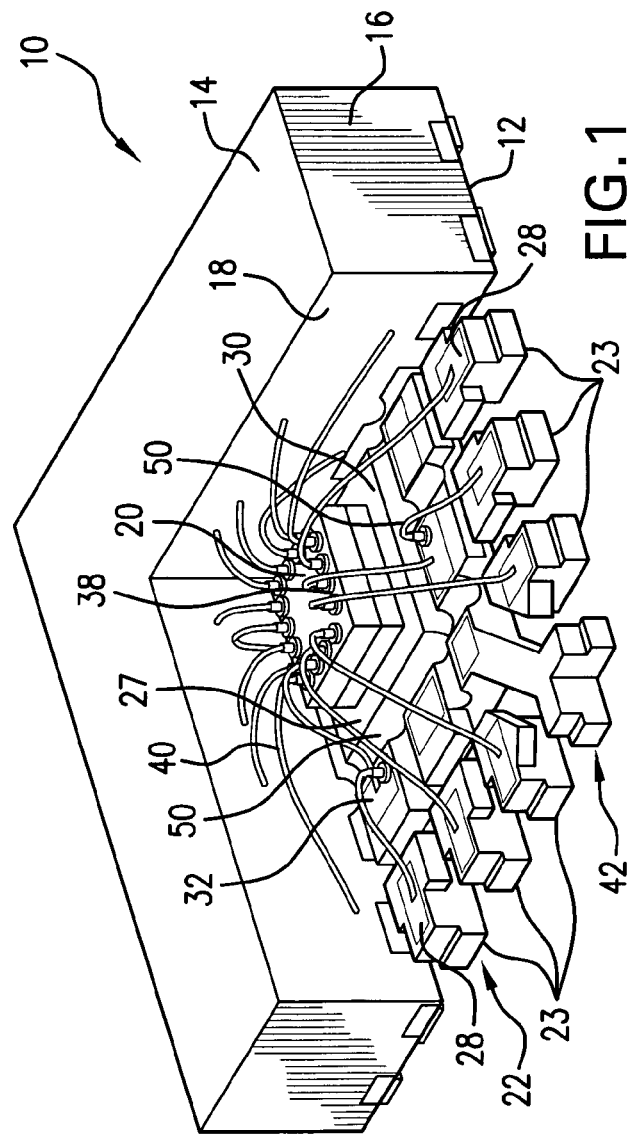
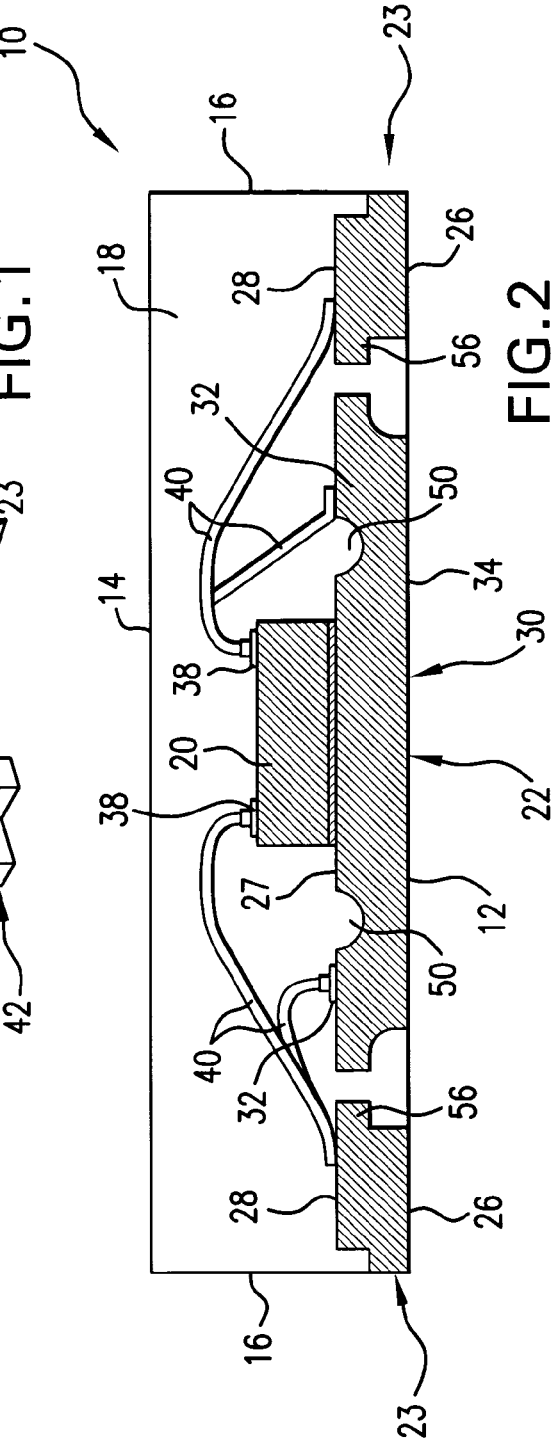

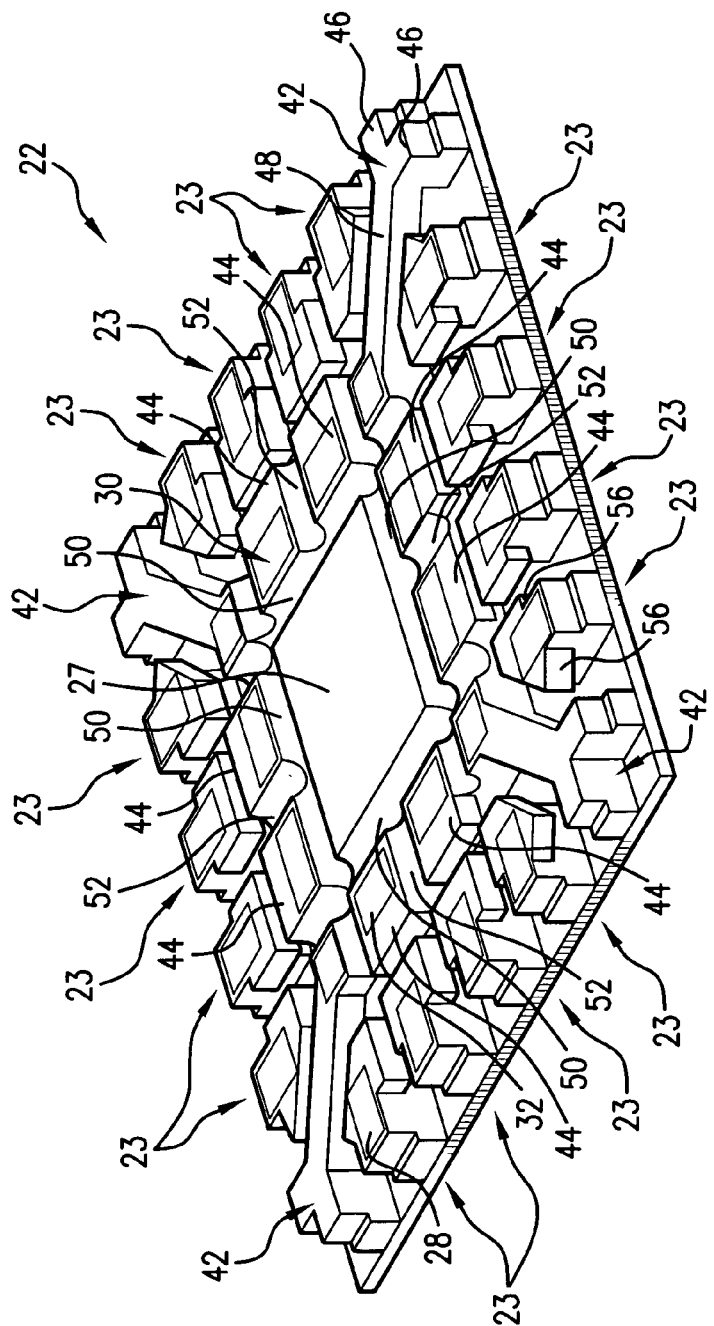
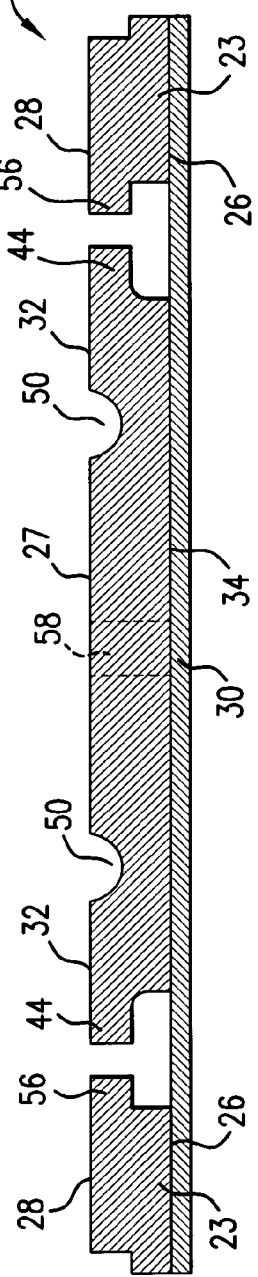
FIG. 3
FIG. 4

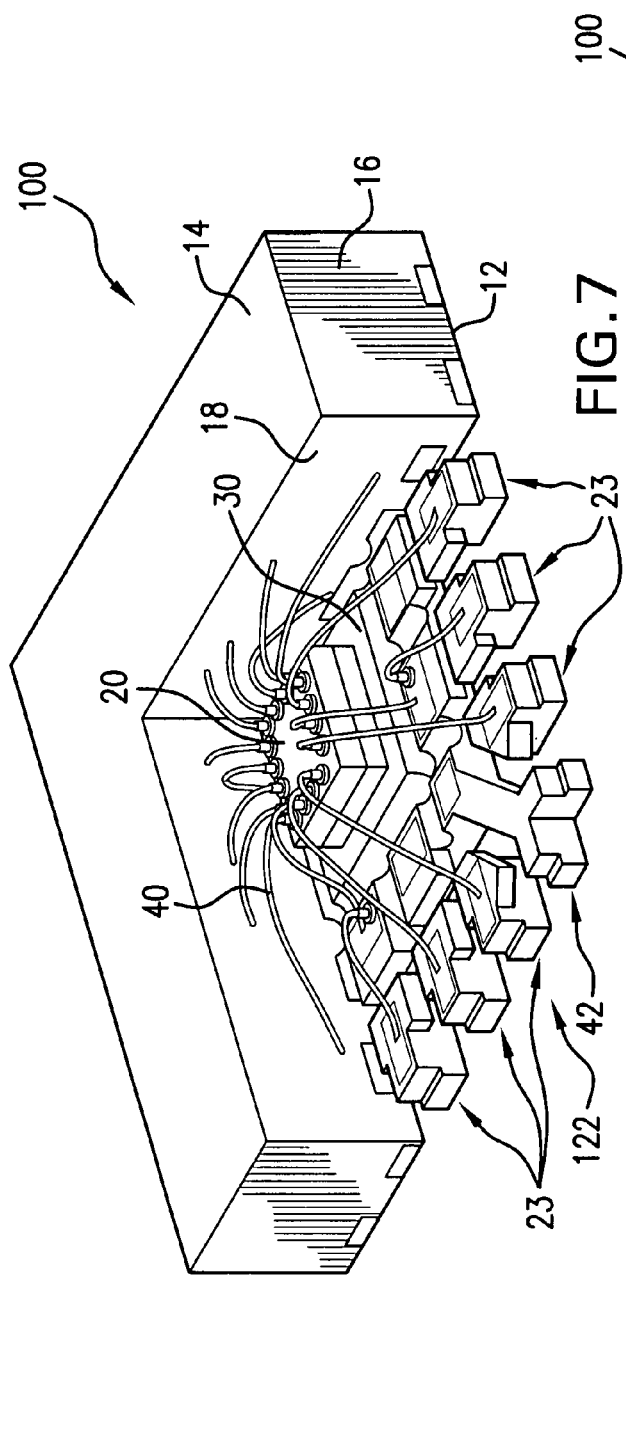
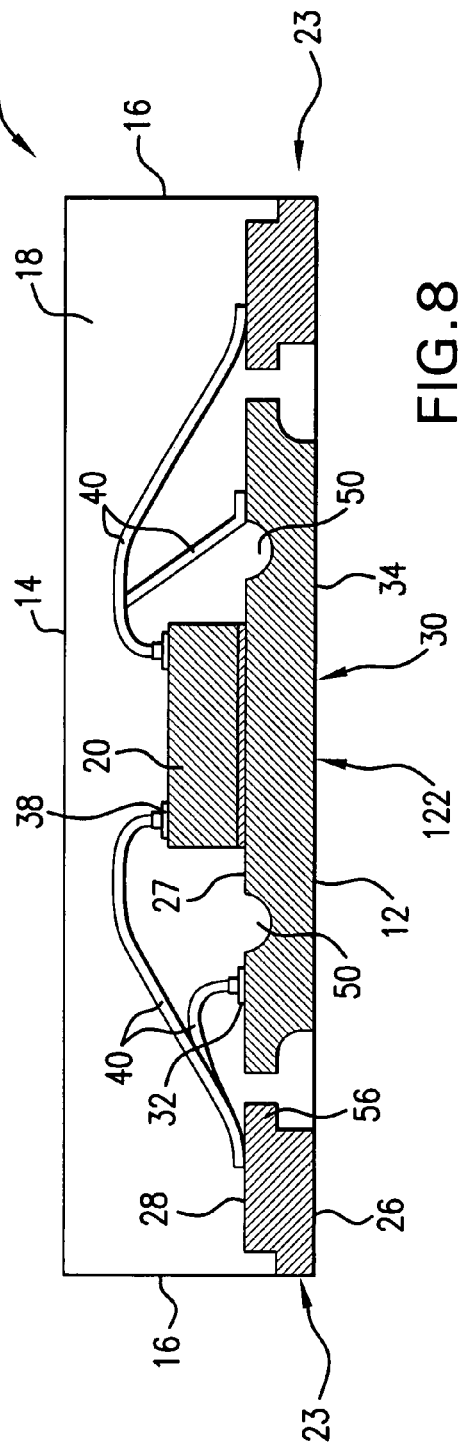
FIG. 7
FIG. 8

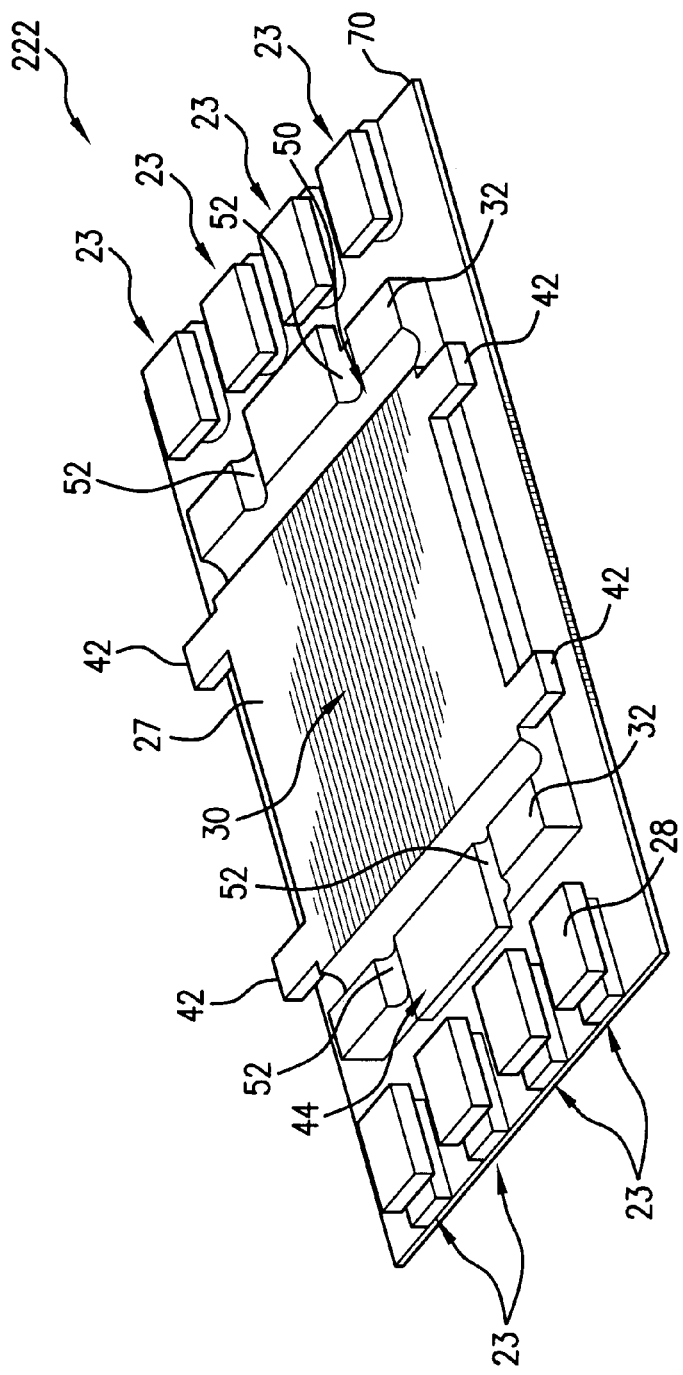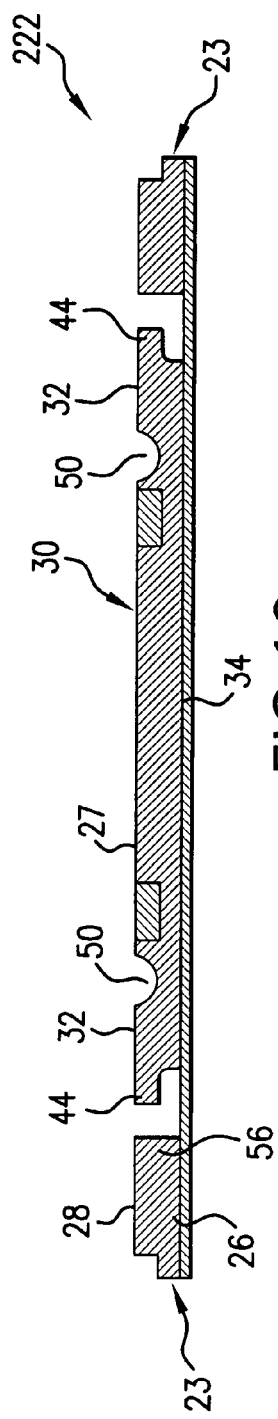

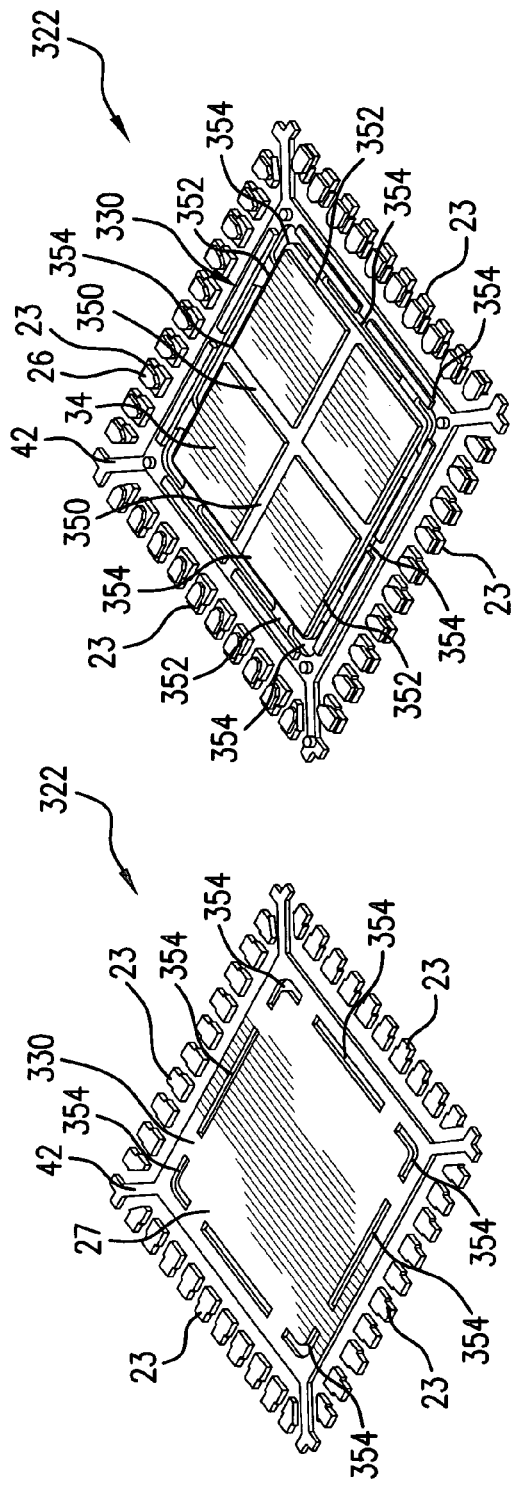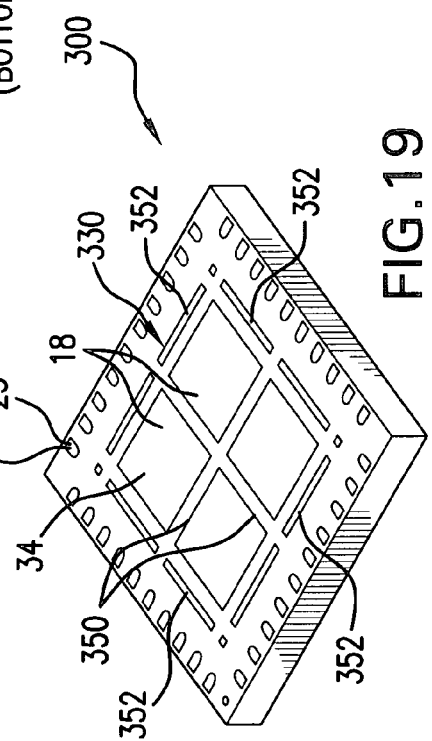
FIG. 18 (BOTTOM)
FIG. 17 (TOP)
FIG. 19

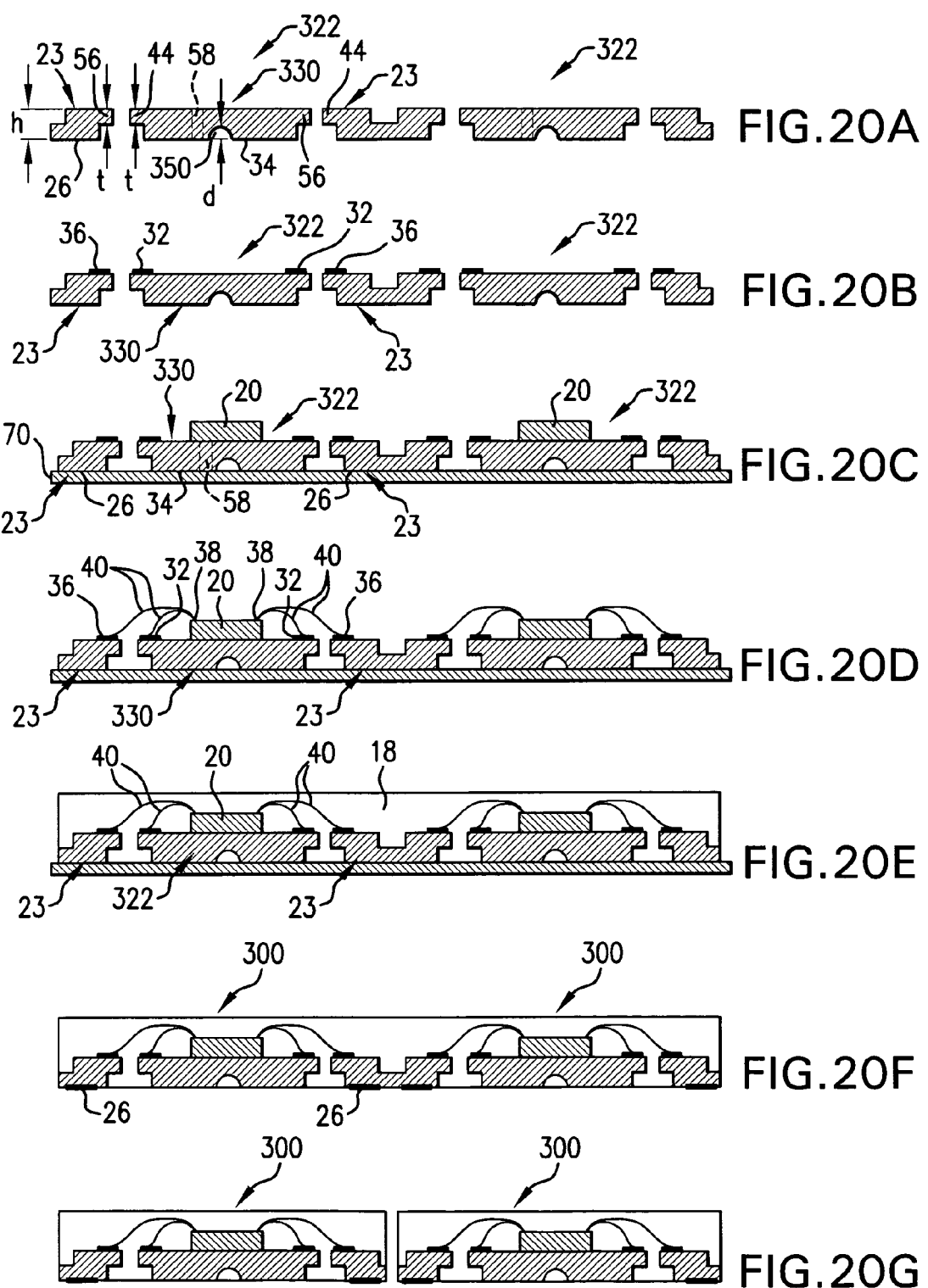

DIE PAD FOR SEMICONDUCTOR PACKAGES AND METHODS OF MAKING AND USING SAME

BACKGROUND OF THE INVENTION

1. Field of the Invention

This invention relates to semiconductor device packages. More particularly, this invention relates to semiconductor packages having die pads.

2. Description of the Related Art

Semiconductor device packages provide environmental protection to integrated circuit devices (dies). Such packages typically include at least one semiconductor device (die) having its input/output (I/O) pads electrically connected to a lead frame type substrate or an interposer type substrate, with a molding compound coating the die and at least a portion of the substrate. Typically, the I/O pads on the die are electrically connected to bond sites on the substrate using either a wire bonding, tape bonding, or flip-chip bonding method. The lead frame or interposer substrate transmits electrical signals between the I/O pads and an electrical circuit external to the package.

In semiconductor device packages having a lead frame type substrate, electrical signals are transmitted between at least one die and external circuitry, such as a printed circuit board, by an electrically conductive lead frame. The lead frame includes a plurality of leads, each having an inner lead end and an opposing outer lead end. The inner lead end is electrically connected to the I/O pads on the die, and the outer lead end provides a terminal for connecting to the external circuitry. Where the outer lead end terminates at a face of the package body, the package is known as a "no-lead" or "leadless" package. Examples of well-known no-lead packages include quad flat no-lead (QFN) packages, which have four sets of leads disposed around the perimeter of the bottom of a square package body, and dual flat no-lead (DFN) packages, which have two sets of leads disposed along opposite sides of the bottom of a package body.

In many semiconductor device packages, the die is attached to a portion of the lead frame that serves to support the die and to transfer heat between the die and an environment external to the package. This portion of the lead frame is known as a die pad (also known as a die paddle, die paddle, heat spreader, or heat sink). In certain semiconductor device packages, the die pad is exposed at a surface of the package. With the die pad exposed, heat transfer between the die and the environment external to the package is enhanced. However, because the die pad is exposed at a surface of the package, there is no molding compound to support the exposed surface of the die pad, and steps must be taken to ensure that the die pad does not become dislodged from the package.

One method to prevent the die pad from being dislodged from the package is described in U.S. Pat. No. 6,143,981, which is incorporated by reference herein in its entirety. The '981 patent is directed to a package wherein the die pad and the leads have side surfaces that include reentrant portions and asperities to engage the encapsulant. The reentrant positions and asperities enhance the connection of the die pad and tabs to the plastic encapsulating material.

Another method to prevent the die pad from being dislodged from the package is described in U.S. Pat. No. 6,281,568, which is incorporated by reference herein in its entirety. The '568 patent is directed to a package wherein the lower surfaces of the die pad and leads are provided with a stepped profile by an etching step that etches partially through the thickness of a peripheral portion of the die pad, and also etches partially through the thickness of portions of the leads. Encapsulant material fills in beneath the recessed, substantially horizontal surfaces of the die pad and leads formed by the above-described etching step, and thereby prevents the die pad and leads from being pulled vertically from the package body.

While the solutions described in the '981 and '568 patents are acceptable for certain applications, they are not without their deficiencies. For example, the half-etched steps or reentrant portions on the side surfaces of the die pad may not be sufficiently robust to retain the die pad within the package under certain conditions or for certain applications. In another example, as described in U.S. Pat. No. 6,525,406, which is incorporated by reference herein in its entirety, the size or length of this half-etched step or reentrant portion is insufficient to thoroughly prevent moisture from permeating into the vicinity of the semiconductor chip. Thus, much moisture may be collected in the vicinity of the semiconductor chip under the high temperature conditions that exist during the operation of a semiconductor chip. The moisture may then spread widely over the inside of the semiconductor package, resulting in cracking of the semiconductor package or causing protuberances to form on the surface of the semiconductor package.

To cure this deficiency, the '406 patent proposes that a perimeter of both an upper and lower surface of the die pad be half-etched to increase the moisture-permeation path of the finished package, where the moisture-permeation path between the semiconductor chip and the bottom surface of the package along the interface of the die pad and molding compound. While this solution is effective in increasing the moisture-permeation path of the finished package, half-etching the perimeter of both the upper and lower surface of the die pad results in a very thin protrusion (relative to the thickness of the die pad) extending around the perimeter of the die pad, which may break during fabrication or use of the package.

Thus, there remains a need for a package having an exposed die pad that is resistant to being dislodged from the package.

BRIEF SUMMARY OF THE INVENTION

The above-described deficiencies of the prior art are overcome or alleviated by a semiconductor device package comprising a semiconductor device and an electrically conductive lead frame at least partially covered by a molding compound. The molding compound forms at least a portion of a first package face, a second package face opposite the first package face, and package side faces extending between the first and second package faces. The electrically conductive lead frame includes a plurality of leads disposed proximate a perimeter of the package and a die pad disposed in a central region formed by the plurality of leads. Each lead has a first lead surface disposed at the first package face and a bond site to which the semiconductor device is electrically connected. The die pad includes a first die pad surface disposed at the first package face, and a second die pad surface opposite the first die pad surface. The semiconductor device is attached to a central region of the second die pad surface, and the second die pad surface extends outward from the die and is in contact with the molding compound. At least a portion of the second surface in contact with the molding compound is roughened to improve adhesion between the molding compound and the die pad. The roughened portion of the second surface may have an average roughness (Ra) of greater than about 0.4 microns, and more preferably greater than about 0.5 microns.

In another aspect, a first plurality of grooves is disposed in the second die pad surface, with each groove in the first plurality of grooves extending generally parallel to and offset from a respective die pad side surface and being positioned between the respective die pad side surface and the semiconductor device. The depth of the grooves may be between about 30% to about 70% of the profile height of the die pad, and more preferably between about 40% to about 60% of the profile height of the die pad. A second plurality of grooves may be disposed in the second die pad surface, with each groove in the second plurality of grooves extending from a groove in the first plurality of grooves to a respective die pad side surface.

In another aspect, at least one first groove is disposed across the first die pad surface, with the at least one first groove extending beneath the semiconductor device. The depth of the at least one first groove may be between about 30% to about 70% of the profile height of the die pad, and more preferably between about 40% to about 60% of the profile height of the die pad. A plurality of second grooves may be disposed in the first die pad surface, with each second groove in the plurality of second grooves extending generally parallel to and offset from a respective die pad side surface. The die pad may include at least one aperture disposed therethrough, with the at least one aperture being positioned in at least one of the first and second grooves for receiving the molding compound.

In any of the embodiments, the die pad may further include tie bars extending therefrom, and at least one lip may extend from a side surface of the die pad. Also, at least one aperture may extend from the first side of the die pad to the second side of the die pad, with the semiconductor device spanning the at least one aperture for facilitating the egress of moisture from the package.

A method of forming a semiconductor device package comprises: forming an electrically conductive lead frame comprising: a plurality of leads disposed proximate a perimeter of the package, and a die pad disposed in a central region formed by the plurality of leads; roughening at least a portion of a second surface of the die pad; attaching a semiconductor device to the second surface of the die pad; electrically connecting I/O pads on the semiconductor device to the leads; and applying a molding compound to the semiconductor device and lead frame such that the molding compound adheres to the roughened portion of the second surface of the lead frame and such that a first surface of the lead frame opposite the second surface of the lead frame is exposed from the molding compound. The method further comprise: after applying the molding compound, singulating the plurality of interconnected lead frames to provide a plurality of semiconductor devices. The roughened portion of the second surface may have an average roughness (Ra) of greater than about 0.4 microns, and more preferably greater than about 0.5 microns.

In one aspect, the method includes forming a plurality of grooves in the second die pad surface, with each groove in the plurality of grooves extending generally parallel to and offset from a respective die pad side surface and being positioned between the respective die pad side surface and the semiconductor device. The method may also include forming a second plurality of grooves in the second die pad surface, each groove in the second plurality of grooves extending from a groove in the first plurality of grooves to a respective die pad side surface.

In another aspect, the method includes forming at least one first groove in the first die pad surface, with the at least one first groove extending beneath the semiconductor device. The method may also include forming a plurality of second grooves in the first die pad surface, with each second groove in the second plurality of second grooves extending generally parallel to and offset from a respective die pad side surface. The method may further include disposing at least one aperture through the die pad, where the at least one aperture is positioned in at least one of the first and second grooves and receives the molding compound.

In any of the embodiments, the die pad may further include tie bars extending therefrom, and the method may further include: etching a portion of a surface of the tie bar coplanar with the first surface of the die pad to form a surface of the tie bar offset from the first surface of the die pad. The method may also include forming at least one lip at a side surface of the die pad. Also, at least one aperture may extend from the first side of the die pad to the second side of the die pad, with the semiconductor device spanning the at least one aperture for facilitating the egress of moisture from the package.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

The invention will be more fully understood from the following detailed description taken in conjunction with the accompanying drawings wherein like elements are numbered alike, and in which:

FIG. 1 is a partial cut-away, top perspective view of a quad, no-lead, wirebonded semiconductor device package in accordance with a first embodiment of the present invention;

FIG. 2 is a cross-sectional elevation view of the semiconductor device package of FIG. 1;

FIG. 3 is a top perspective view of a lead frame of the semiconductor device package of FIG. 1;

FIG. 4 is a cross-sectional elevation view of the lead frame of FIG. 3;

FIG. 7 is a partial cut-away, top perspective view of a quad, no-lead, wirebonded semiconductor device package in accordance with a second embodiment of the present invention;

FIG. 8 is a cross-sectional elevation view of the semiconductor device package of FIG. 7;

FIG. 9 is a top perspective view of a lead frame for a dual, no-lead, wirebonded semiconductor device package in accordance with a third embodiment of the present invention; and FIG. 10 is a cross-sectional elevation view of the lead frame of FIG. 9.

FIG. 17 is a top perspective view of a lead frame including a plurality of apertures disposed therethrough.

FIG. 18 is a bottom perspective view of the lead frame of FIG. 17, which reveals grooves disposed across the bottom surface of the die pad.

FIG. 19 is a bottom perspective view of a semiconductor device package including the lead frame of FIGS. 17 and 18.

FIG. 20a-g depict a cross-sectional elevation view of the semiconductor device package of FIG. 11 in various stages of assembly.

DETAILED DESCRIPTION

Figure 5:
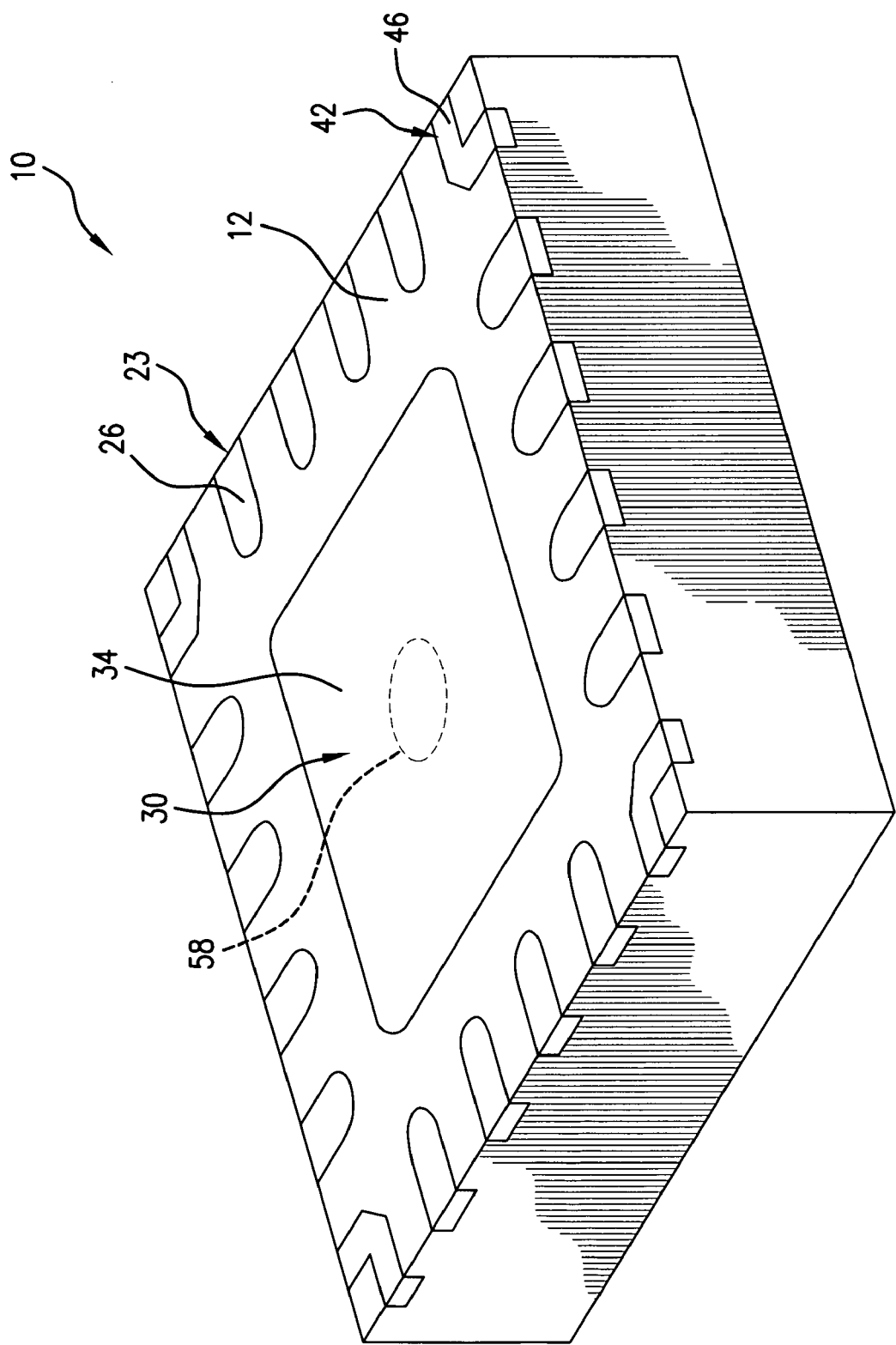
FIG. 5 is a bottom perspective view of the semiconductor device package of FIG. 1.

FIG. 1 is a partial cut-away, top perspective view of a quad, no-lead, wirebonded semiconductor device package 10 in accordance with a first embodiment of the present invention, and FIG. 2 is a cross-sectional elevation view of the semiconductor device package 10. Referring to FIGS. 1 and 2, the semiconductor device package 10 has a bottom (first) package face 12, a top (second) package face 14 opposite the bottom package face 12, and package side faces 16 extending between the bottom and top package faces 12, 14. The various package faces are formed in part by a molding compound 18, which covers a semiconductor device (die) 20 and portions of an electrically conductive lead frame 22. The electrically conductive lead frame 22 includes a plurality of leads 23. Each of the leads 23 has a first lead surface 26 disposed at the bottom package face 12 and a bond site 28 opposite the first lead surface 26. In the embodiment shown, the bond sites 28 are electrically connected to associated input/output I/O pads 38 on the die 20 via wires 40.

Located in a central region formed by the plurality of leads 23 is a die support pad (die pad) 30. A first (bottom) surface 34 of the die pad 30 is exposed at the bottom package face 14, and the die 20 is attached to a second (top) surface 27 of the die pad 30. The die pad 30 may have bond sites 32 formed thereon and electrically connected by wires 40 to associated I/O pads 38 on the die 20 and to bond sites 28 on the leads 23. Electrical signals are transmitted between the die 20 and the external circuitry via each I/O pad 38, wire 40, and lead 23.

FIG. 3 depicts a top perspective view of the lead frame 22, and FIG. 4 depicts a cross-sectional elevation view of the lead frame 22. As shown in FIGS. 3 and 4, extending from each corner of the die pad 30 is a tie bar 42, and extending from each side surface of the die pad 30 are lips 44. The tie bars 42 are formed as a generally straight bar having protrusions 46 extending from an end thereof and having a reduced-thickness central region 48. The lips 44 comprise reduced thickness protrusions extending from the side surfaces of the die pad 30. The reduced thickness of the tie bars 42 and lips 44 allows the molding compound 18 to be received under the tie bars 42 and lips 44, thus allowing the tie bars 42 and lips 44 to anchor the die pad 30 in the molding compound 18 and help retain the die pad 30 in the package 10.

In accordance with various aspects of the present invention, the die pad 30 includes additional features that help to secure the die pad 30 in the package 10 and prevent moisture from permeating into the vicinity of the die 20. As best seen in FIG. 1, the die pad 30 has a perimeter larger than that of the die 20 such that the second die pad surface 27 extends outward from the die 20 and contacts the molding compound 18. At least a portion of second die pad surface 27 contacting the molding compound 18 is roughened to improve adhesion of the die pad 30 to the molding compound 18. Also, because the die pad 30 extends outward from the die 20, the moisture-permeation path is increased In addition, as best seen in FIGS. 3 and 4, the die pad 30 also includes a first plurality of grooves 50 disposed in the second die pad surface 26. Each groove 50 extends generally parallel to and offset from a respective die pad 30 side surface and is positioned between the respective die pad 30 side surface and the semiconductor device 20 (FIG. 1). As shown in FIG. 2, the grooves 50 receive the molding compound 18 and thus help to lock the die pad 30 to the molding compound 18. Also, the grooves 50 increase the moisture-permeation path of the die pad 30. In the embodiment shown, each of the grooves 50 extends along the entire width of the die pad 30 such that adjacent grooves 50 intersect near the corners of the die pad 30. A second plurality of grooves 52 may be disposed in the second die pad surface 26, with each groove 52 extending from a groove 50 to a respective die pad 30 side surface. The second grooves 52 receive the molding compound 18 and further help to lock the die pad 30 to the molding compound.

Referring to FIGS. 1 and 2, the leads 23 include lips 56 extending therefrom to anchor the leads in the molding compound 18. The leads 23 are spaced apart from each other and from the die pad 30 to electrically isolate the leads 23 from each other and from the die pad 30. In the embodiment shown, the lead frame 22 includes four leads 23 disposed on each of the four sides of the die pad 30. It will be appreciated, however, that the number and location of the leads 23 may be modified as needed for a particular application. For example, the lead frame 22 may include two sets of leads 23 disposed on opposing sides of the die pad 30 for use in a dual, no-lead, semiconductor package, as will be described hereinafter.

FIG. 5 is a bottom perspective view of the package 10. As shown in FIG. 5, the lead surface 26 of each lead 23 and the first surface 34 of the die pad 30 are exposed on the bottom face 12 of the package 10. Also exposed at the bottom face 12 are bottom surfaces of the protrusions 46 at the end of the tie bars 42. The package 10 may be electrically connected to an external circuit, such as a printed circuit board, another semiconductor device package, or test device, at any of the contact surfaces 26 and the first surface 34 of the die pad.

As shown in phantom in FIGS. 4 and 5, the die pad 30 may include at least one aperture 58 disposed therein and extending from the first surface 34 of the die pad 30 to the second surface 27 of the die pad 30. The at least one aperture 58 is located beneath the die 20, with the die 20 spanning the at least one aperture 58, to facilitate the egress of moisture absorbed by the package 10.

Figure 6A:
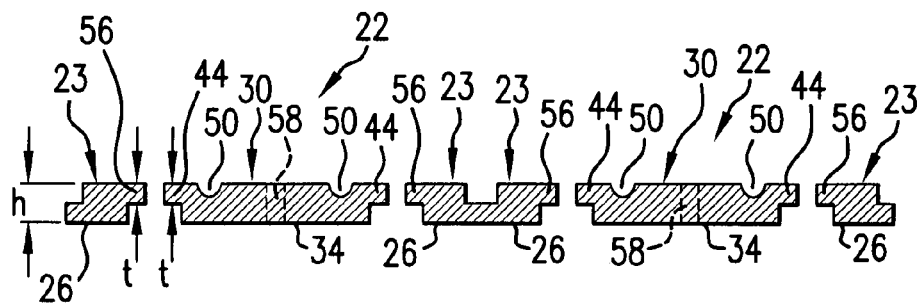
FIG. 6a-h depict a cross-sectional elevation view of the semiconductor device package of FIG. 1 in various stages of assembly.

Referring now to FIG. 6a-h, package 10 is shown in various stages of assembly. As shown in FIG. 6a, more than one lead frame 22 may be interconnected to allow for simultaneous assembly of packages 10. While FIG. 6a shows two interconnected lead frames 22, it is contemplated that any number of lead frames may be interconnected for assembly of multiple packages 10. It is also contemplated that the packages 10 may be assembled individually.

The lead frames 22 may be formed from a sheet of any suitable conductor and is preferably copper or a copper-base alloy. By copper-base alloy it is meant that the material contains more than 50%, by weight, of copper. The sheet of conductive material forming the lead frames 22 has a profile height "h" equal to the desired profile height of the die pad 30 and contacts 23.

The features of the lead frame 22, including the die pad 30, the leads 23, apertures 58 in the die pad 30, and tie bars 42 (FIG. 3) may be formed using any known method such as stamping, chemical etching, laser ablation, or the like. The various recesses formed in each of these features are preferably formed using a controlled subtractive process such as chemical etching or laser ablation. For example, each surface intended to form the contact surfaces 26 of the leads 23 and first surface 34 of the die pad 30 and tie bars 42 (FIG. 4) may be coated with a chemical resist and the remaining surface exposed to a suitable etchant for a time effective to reduce the thickness beneath the remaining surface to the desired thickness "t" of the lips 44 and 56 and the central region 48 tie bars 42 (FIG. 3). The thickness "t" of the lips 44 and 56 and the central region 48 of the tie bars 42 may be between about 30% to about 70% of the profile height "h" of the die pad 30, and more preferably between about 40% to about 60% of the profile height "h" of the die pad 30.

Similarly, the intended upper surfaces of these structures may then be coated with the chemical resist, and the remaining surface exposed to the etchant for a time effective to remove the material to form the grooves 50 and 52 in the die pad 30 and the reduced thickness portion on the outboard end of the contacts 26. The depth of the grooves 50 and the thickness of the reduced thickness portion on the outboard end of the contacts may be between about 30% to about 70% of the profile height of the die pad 30, and more preferably between about 40% to about 60% of the profile height of the die pad 30.

Figure 6B:
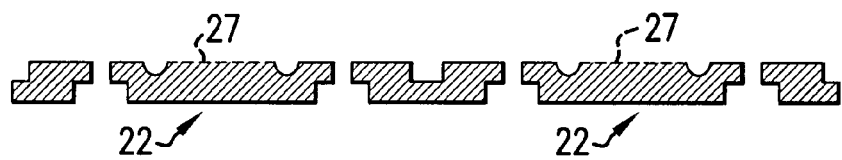

Referring to FIG. 6*b*, either before or after the features of the lead frame 22 are formed, the second die pad surface 27 is roughened using any convenient method. For example, the second die pad surface 27 may be roughened using mechanical abrading (e.g., sand blasting, scratching, etching, microetching, etc.), surface deformation (e.g., punching, machining, rough rolling, etc.), or chemical abrading. One exemplary technique involves the formation of a plurality of copper or copper oxide dendrites to roughen the surface. U.S. Pat. Nos. 4,468,293 and 4,515,671, both of which are incorporated by reference herein in their entirety, disclose this treatment. Another electrolytic surface roughening treatment is the deposition of copper/nickel nodules onto the surface, as disclosed in U.S. Pat. No. 5,800,930, which is incorporated by reference herein in its entirety. In another example, U.S. Pat. No. 5,114,543 describes a chemical abrading (etching) process in which copper is immersed in an aqueous solution including ammonium persulfate of about 20 to 100 g/l for about 20 to 100 seconds at a bath temperature of about 30 to 50 degrees C.

The second die pad surface 27 preferably has an average roughness (Ra) of greater than about 0.4 microns (μm), and more preferably greater than about 0.5 microns. The average surface roughness is defined as the arithmetic average value of all absolute distances of the roughness profile from the center line within the measuring length. The roughness profile is determined utilizing a profilometer with a diamond stylus (contact method).

Figure 6C:
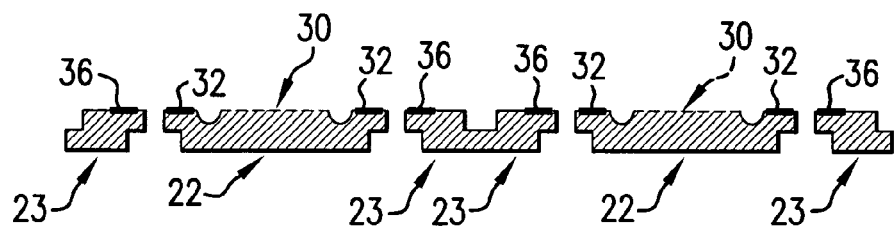

Referring to FIG. 6*c*, after the lead frame 22 is formed, the bond sites 36 on the leads 23 and the bond sites 32 on the die pad 30 may be plated with a material to facilitate bonding with the bond wire. For example, the bond sites 32 and 36 may be plated with one or more of nickel, palladium, gold, silver, and any other wire-bondable metallurgy.

Figure 6D:
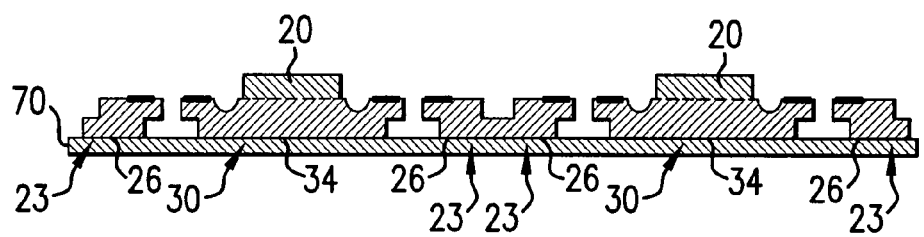

Referring to FIG. 6*d*, in preparation for wirebonding, the lead surface 26 of each lead 23, the first surface 34 of the die pad 30, and bottom surfaces of the tie bar 42 protrusions 46 (FIG. 3) are secured to a surface 70. In the embodiment shown, the surface 70 is formed on an adhesive tape. Next, the die 20 is secured to the die pad 30 using any convenient method, such as solder, epoxy, double-sided adhesive tape, and the like.

Figure 6E:
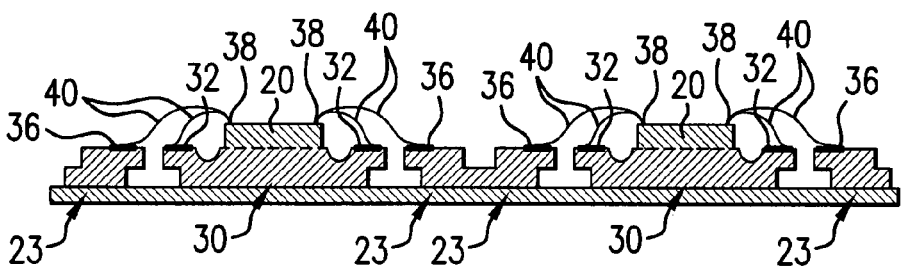

Referring to FIG. 6*e*, after the die 20 is secured to the die pad 30, wires 40 are individually connected between I/O pads 38 on the die 20 and the bond sites 36, 32 on the leads 23 and die pad 30, respectively. For example, the wirebonding may be performed using ultrasonic bonding, where a combination of pressure and ultrasonic vibration bursts are applied to form a metallurgical cold weld, thermocompression bonding, where a combination of pressure and elevated temperature are applied to form a weld, or thermosonic bonding where a combination of pressure, elevated temperature, and ultrasonic vibration bursts are applied to form a weld. The type of wire 40 used in the bonding is preferably made from gold, gold based alloy, aluminum, or aluminum based alloy. As an alternative to wirebonding, tape automated bonding (TAB) may be used.

Figure 6F:
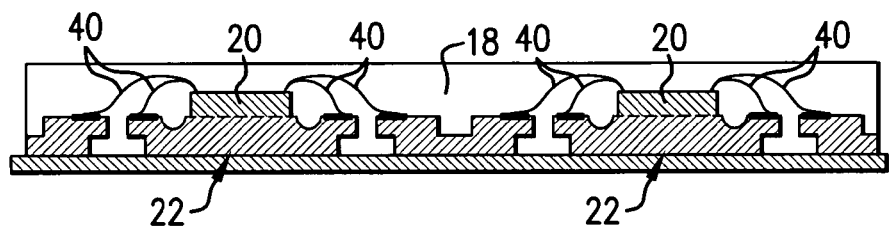

Referring to FIG. 6*f*, after the wire bonding is completed, the die 20, lead frame 22, and bond wires 40 are covered with the molding compound 18. The molding compound 18 may be applied using any convenient technique, such as a transfer or injection molding process. The molding compound is an electrically insulative material, preferably a polymer molding resin, such as an epoxy, having a flow temperature in the range of between about 250° C. to about 300° C. The molding compound 18 may also be a low temperature thermal glass composite.

Figure 6G:
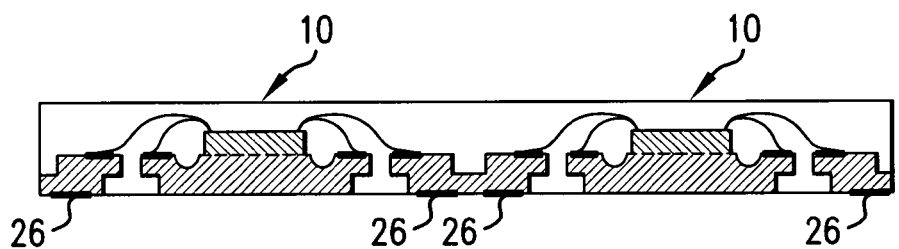
Figure 6H:
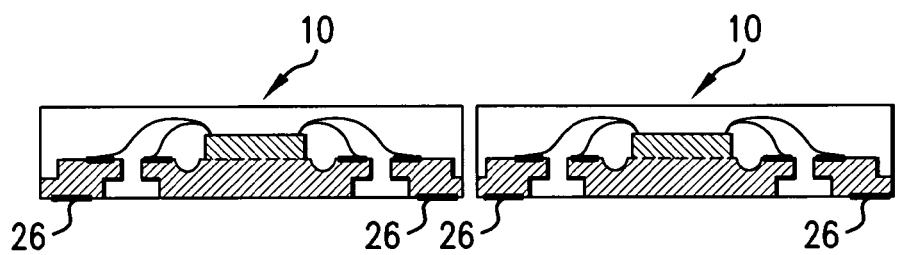

Referring to FIG. 6*g*, after coating, the interconnected packages 10 are separated from the surface 70 and the contact surfaces 26 may be plated with a material to facilitate electrical connection with the external electrical circuit. For example, the contact surfaces 26 may be plated with one or more of nickel, palladium, gold, silver, and any other suitable material. The interconnected packages 10 are then singulated by sawing with a blade, water jet, or the like, as shown in FIG. 6*h*.

It is contemplated that the die pad 30 may incorporate any one or both of the roughened surface 27 and the grooves 50, 52, with or without the use of lips 44 and tie bars 42. For example, FIG. 7 is a partial cut-away, top perspective view of a quad, no-lead, wirebonded semiconductor device package 100 in accordance with a second embodiment of the present invention, and FIG. 8 is a cross-sectional elevation view of the semiconductor device package 100. The package 100 of FIGS. 7 and 8 is substantially similar to the package 10 shown in FIGS. 1-6, except that the lead frame 122 in package 100 does not include lips 44 protruding from the sides of the die pad 30, as found in the lead frame 22 of package 10. Like the lead frame 22, the lead frame 122 includes a roughened surface 27 and channels 50 and 52 disposed in the die pad 30, which are effective in securing the die pad 30 to the molding compound 18.

It is also contemplated that the number and location of the leads 23 may be modified as needed for a particular application. For example, FIG. 9 is a top perspective view of a lead frame 222 for a dual, no-lead, wirebonded semiconductor device package in accordance with a third embodiment of the present invention, and FIG. 10 is a cross-sectional elevation view of the lead frame 222. The lead frame 222 of FIGS. 9 and 10 is substantially similar to the lead frame 22 shown in FIGS. 1-6, except that the lead frame 222 includes leads 23 disposed on two sides of the die pad 30 rather than on all four sides, as in the lead frame 22. Also unlike the die pad 30 in lead frame 22, the die pad 30 in lead frame 222 includes channels 50, 52 and tabs 44 on only two sides of the die pad 30 rather than four, and the tie bars 42 extend from the sides of the die pad 30 rather than the corners. Like the lead frame 22, the lead frame 222 includes a roughened surface 27 and channels 50 and 52 disposed in the die pad 30. As with the previous embodiments, it is contemplated that the die pad 30 may incorporate any one or both of the roughened surface 27 and the grooves 50, 52, with or without the use of lips 44 and tie bars 42.

The above-described aspects of the present invention provide a package having an exposed die pad where the die pad is resistant to being dislodged from the package and where moisture is prevented from permeating into the vicinity of the semiconductor chip. By increasing the perimeter of the die pad 30 such that it protrudes from the die 20 and by roughening the second surface 27 of the die pad 30, the adhesion of the die pad 30 to the molding compound 18 is improved and the moisture-permeation path (i.e., the distance that moisture travels along the interface of the die pad 30 and molding compound 18) is increased. Adhesion of the die pad 30 to the molding compound 18 is further improved, and the moisture-permeation path is further increased, by disposing a first plurality of grooves 50 in the second die pad surface 27. Furthermore, the die pad 30 to molding compound 18 adhesion is increased with the addition of the second plurality of grooves 52 in the second die pad surface 27.

Figures 11, 12:
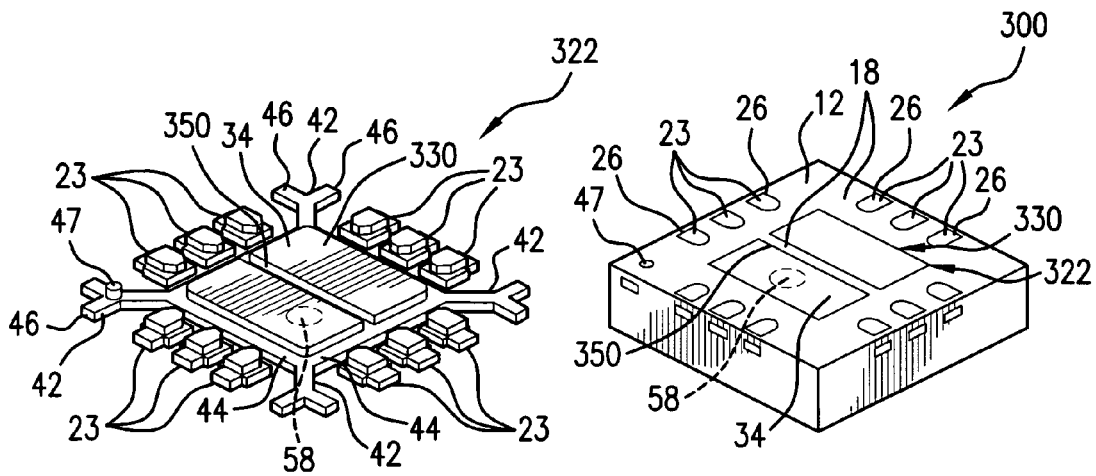
FIG. 11 is a bottom perspective view of a lead frame having a groove disposed in the bottom surface of the die pad.
FIG. 12 is a bottom perspective view of a semiconductor device package including the lead frame of FIG. 11.

FIG. 11 depicts a bottom perspective view of a lead frame 322 in accordance with another aspect of the present invention, and FIG. 12 depicts a bottom perspective view of a package 300 including the lead frame 322. As shown in FIG. 11, the lead frame 322 includes a plurality of leads 23 disposed around, and spaced apart from, a die pad 330. Extending from each corner of the die pad 330 is a tie bar 42, and extending from each side surface of the die pad 330 are lips 44. The tie bars 42 are formed as a generally straight bar having protrusions 46 extending from an end thereof and having a reduced-thickness central region 48. The lips 44 comprise reduced thickness protrusions extending from the side surfaces of the die pad 330. The reduced thickness of the tie bars 42 and lips 44 allows the molding compound 18, as shown in FIG. 12, to be received under the tie bars 42 and lips 44, thus allowing the tie bars 42 and lips 44 to anchor the die pad 330 in the molding compound 18 and help retain the die pad 330 in the package 300.

Referring again to FIG. 11, the leads 23 are spaced apart from each other and from the die pad 330 to electrically isolate the leads 23 from each other and from the die pad 330. In the embodiment shown, the lead frame 322 includes three leads 23 disposed on each of the four sides of the die pad 330. It will be appreciated, however, that the number and location of the leads 23 may be modified as needed for a particular application. For example, the lead frame 322 may include two sets of leads 23 disposed on opposing sides of the die pad 330 for use in a dual, no-lead, semiconductor package, similar to that described above with reference to FIG. 10.

As shown in FIG. 12, the lead surface 26 of each lead 23 and the first surface 34 of the die pad 330 are exposed on the bottom face 12 of the package 300. Also exposed at the bottom face 12 is a post 47, which extends from one of the tie bars 42. The package 300 may be electrically connected to an external circuit, such as a printed circuit board, another semiconductor device package, or test device, at any of the contact surfaces 26 and the first surface 34 of the die pad 330. The post 47 may be used to ensure the proper orientation of package 300 when the package 300 is being electrically connected to the external circuit.

Similar to that previously described with reference to FIG. 1, the die pad 330 may include at least one aperture 58 (shown in phantom) disposed through the die pad 330 and extending from the top (second) surface 27 of the die pad 330 to the bottom (first) surface 34 of the die pad 330. The at least one aperture 58 is located beneath the die within the package 300 to facilitate the egress of moisture absorbed by the package 300.

In accordance with various aspects of the present invention, the die pad 330 includes additional features that help to secure the die pad 330 in the package 300. As shown in FIG. 11, the die pad 330 includes a first groove 350 disposed across the first (bottom) die pad surface 34 and extending beneath the portion of the die pad 330 on which the die rests. As shown in FIG. 12, the first groove 350 receives the molding compound 18 to help secure the die pad 330 in the package 300.

Figures 13, 14:
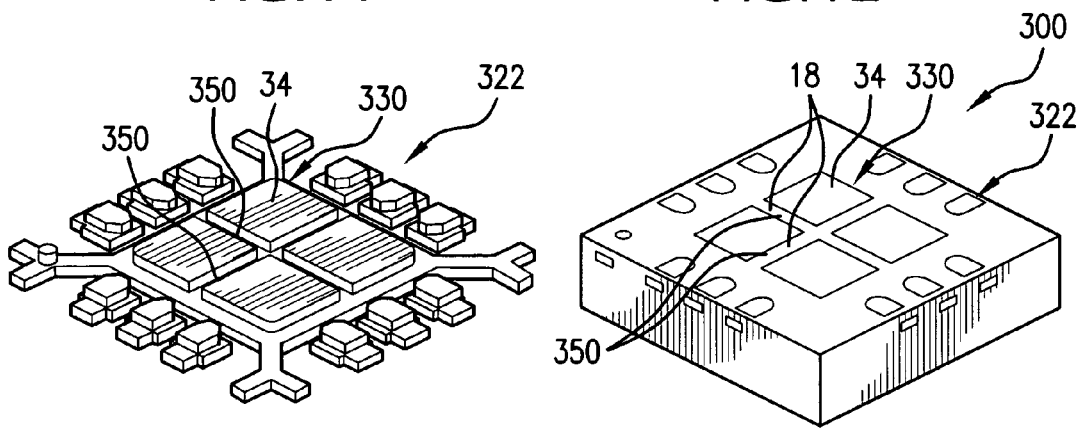
FIG. 13 is a bottom perspective view of a lead frame having grooves disposed across the bottom surface of the die pad.
FIG. 14 is a bottom perspective view of a semiconductor device package including the lead frame of FIG. 13.
Figures 15, 16:
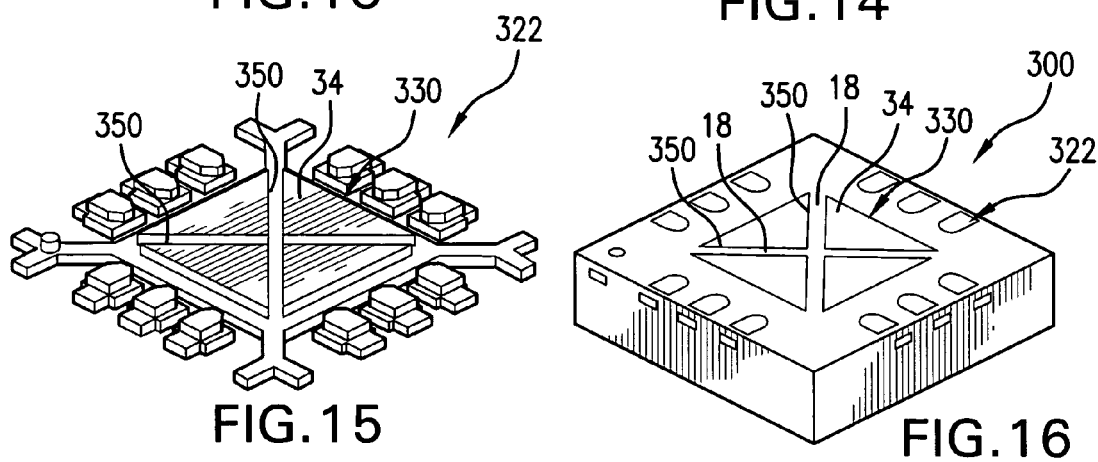
FIG. 15 is a bottom perspective view of a lead frame having grooves disposed diagonally across the bottom surface of the die pad.
FIG. 16 is a bottom perspective view of a semiconductor device package including the lead frame of FIG. 15.

FIGS. 13-16 depict alternative arrangements of first grooves 350 on the bottom of the die pad 330. For example, FIG. 13 depicts an embodiment in which two first grooves 350 are disposed across the first die pad surface 34 and extend from one side edge of the die pad 330 to an opposite edge of the die pad 330. FIG. 14 depicts a bottom perspective view of a package 300 including the lead frame 322 of FIG. 13. In another example, FIG. 15 depicts an embodiment in which two first grooves 350 are disposed across the first die pad surface 34 and extend from one corner of the die pad 330 to an opposite corner of the die pad 330. FIG. 16 depicts a bottom perspective view of a package 300 including the lead frame 322 of FIG. 15. While, in the various embodiments described herein, the die pad 330 includes one or two first grooves 350, it is contemplated that any number of first grooves 350 may be used. For example, three, four, five, six, etc. first grooves 350 may be used. While a greater number of first grooves 350 will provide better securing of the die pad 330 within the molding compound 18, an increase in the number of first grooves 350 will also cause a decrease in the exposed surface 34 of the die pad 330 and, as a result, a decrease in the heat dissipation capability of the die pad 330. Accordingly, the number of first grooves 350 is selected based on the requirements of a particular application.

FIGS. 17 and 18 depict top and bottom perspective views, respectively, of an embodiment of the die pad 330 in which second grooves 352 are disposed across the first (bottom) surface 34 of the die pad 330 in addition to first grooves 350. As best seen in FIG. 18, each second groove 352 extends generally parallel to, and is offset from, a respective side surface of the die pad 330. Positioned in the second grooves 352 are a plurality of apertures 354, which extend through the die pad 330 from the first (bottom) surface 34 to the second (top) surface 27. Apertures 354 may also be positioned at the intersection of grooves 352, such that the apertures 354 are positioned at the corners of the die pad 330.

FIG. 19 depicts a bottom perspective view of a package 300 including the die pad 330 of FIGS. 17 and 18. As shown in FIG. 19, the first and second grooves 350, 352 receive the molding compound 18 to help secure the die pad 330 in the package 300. In addition, the molding compound 18 is received within the apertures 354 (FIG. 18) to further secure the die pad 330 in the package 300.

Referring now to FIG. 20*a-g*, package 300 is shown in various stages of assembly. As shown in FIG. 20*a*, more than one lead frame 322 may be interconnected to allow for simultaneous assembly of packages 300. While FIG. 6*a* shows two interconnected lead frames 322, it is contemplated that any number of lead frames 322 may be interconnected for assembly of multiple packages 300. It is also contemplated that the packages 300 may be assembled individually.

The lead frames 322 may be formed from a sheet of any suitable conductor, preferably copper or a copper-base alloy. By copper-base alloy it is meant that the material contains more than 50%, by weight, of copper. The sheet of conductive material forming the lead frames 322 has a profile height "h" equal to the desired profile height of the die pad 330 and contacts 23.

The features of the lead frame 322, including the die pad 330, the leads 23, apertures 58 in the die pad 30, and tie bars 42 (FIG. 11) may be formed using any known method such as stamping, chemical etching, laser ablation, or the like. Similarly, the apertures 354 (FIGS. 17 and 18) disposed through the die pad 330 may be formed using such methods. The various recesses formed in each of these features are preferably formed using a controlled subtractive process such as chemical etching or laser ablation. For example, each surface intended to form the contact surfaces 26 of the leads 23 and first surface 34 of the die pad 330 and tie bars 42 (FIG. 11) may be coated with a chemical resist and the remaining surface exposed to a suitable etchant for a time effective to reduce the thickness beneath the remaining surface to the desired thickness "t" of the lips 44 and 56 and the central region 48 of tie bars 42 (FIG. 11). The thickness "t" of the lips 44 and 56 and the central region 48 of the tie bars 42 may be between about 30% to about 70% of the profile height "h" of the die pad 330, and more preferably between about 40% to about 60% of the profile height "h" of the die pad 330. Furthermore, the remaining surface may be exposed to a suitable etchant for a time effective to create first grooves 350 and second grooves 352 (FIGS. 17 and 18) of a desired depth "d". The depth "d" of the first and second grooves 350, 352 may be between about 30% to about 70% of the profile height of the die pad 330, and more preferably between about 40% to about 60% of the profile height of the die pad 330.

Referring to FIG. 20*b*, after the lead frame 322 is formed, the bond sites 36 on the leads 23 and bond sites 32 on the die pad 330 may be plated with a material to facilitate bonding with a bond wire. For example, the bond sites 32 and 36 may be plated with one or more of nickel, palladium, gold, silver, and any other wire-bondable metallurgy.

Referring to FIG. 20*c*, in preparation for wirebonding, the lead surface 26 of each lead 23 and the first surface 34 of the die pad 330 are secured to a surface 70. In the embodiment shown, the surface 70 is formed on an adhesive tape. Next, a die 20 is secured to the die pad 330 using any convenient method, such as solder, epoxy, double-sided adhesive tape, and the like. As shown in FIG. 20*c*, where an aperture 58 is present, the die 20 is positioned such that it spans the aperture 58.

Referring to FIG. 20*d*, after the die 20 is secured to the die pad 330, wires 40 are individually connected between I/O pads 38 on the die 20 and the bond sites 36, 32 on the leads 23 and die pad 330, respectively. For example, the wirebonding may be performed using ultrasonic bonding, where a combination of pressure and ultrasonic vibration bursts are applied to form a metallurgical cold weld, thermocompression bonding, where a combination of pressure and elevated temperature are applied to form a weld, or thermosonic bonding where a combination of pressure, elevated temperature, and ultrasonic vibration bursts are applied to form a weld. The type of wire 40 used in the bonding is preferably made from gold, gold based alloy, aluminum, or aluminum based alloy. As an alternative to wirebonding, tape automated bonding (TAB) may be used.

Referring to FIG. 20*e*, after the wire bonding is completed, the die 20, leads 23, lead frame 322, and bond wires 40 are covered with the molding compound 18. The molding compound 18 may be applied using any convenient technique, such as a transfer or injection molding process. The molding compound is an electrically insulative material, preferably a polymer molding resin, such as an epoxy, having a flow temperature in the range of between about 250° C. to about 300° C. The molding compound 18 may also be a low temperature thermal glass composite.

Referring to FIG. 20*f*, after coating, the interconnected packages 300 are separated from the surface 70 and the contact surfaces 26 may be plated with a material to facilitate electrical connection with the external electrical circuit. For example, the contact surfaces 26 may be plated with one or more of nickel, palladium, gold, silver and any other suitable material. The interconnected packages 300 are then singulated by sawing with a blade, water jet, or the like, as shown in FIG. 20*g*.

It is contemplated that the die pad 330 may incorporate any of the aforementioned features that help to secure the die pad in the package. For example, either or both of the die pad roughened surface 27 and the grooves 50, 52 described with reference to FIG. 3. It is also contemplated that the number and location of the leads 23 may be modified as needed for a particular application. For example, the lead frame 322 may be configured as a dual, no-lead package including leads 23 disposed on two sides of the die pad 330 rather than on all four sides, similar to that shown in FIG. 9.

A number of embodiments of the present invention have been described. Nevertheless, it will be understood that various modifications may be made without departing from the spirit and scope of the invention. Accordingly, other embodiments are within the scope of the following claims.

What is claimed is:

1. A semiconductor device package comprising:
   a molding compound forming at least a portion of:
   a first package face,
   a second package face opposite the first package face, and
   package side faces extending between the first and second package faces;
   a semiconductor device at least partially covered by the molding compound, the semiconductor device including a plurality of I/O pads; and
   an electrically conductive lead frame comprising:
   a plurality of leads disposed proximate a perimeter of the package, each lead having a first lead surface disposed at the first package face and a bond site to which at least one of the I/O pads is electrically connected, and
   a die pad disposed in a central region formed by the plurality of leads, the die pad including:
   a first die pad surface disposed at the first package face, and
   a second die pad surface opposite the first die pad surface, the semiconductor device is attached to a central region of the second die pad surface, and the second die pad surface extends outward from the die and is in contact with the molding compound, at least a portion of the second die pad surface in contact with the molding compound is roughened to improve adhesion between the molding compound and the die pad, said roughened portion having an average roughness greater than 0.4 micron.

2. The semiconductor device package of claim 1, wherein the roughened portion of the second surface has an average roughness greater than about 0.5 microns.

3. A semiconductor device package comprising:
a molding compound forming at least a portion of:
a first package face,
a second package face opposite the first package face, and
package side faces extending between the first and second package faces;
a semiconductor device at least partially covered by the molding compound, the semiconductor device including a plurality of I/O pads; and
an electrically conductive lead frame comprising:
a plurality of leads disposed proximate a perimeter of the package, each lead having a first lead surface disposed at the first package face and a bond site to which at least one of the I/O pads is electrically connected, and
a die pad disposed in a central region formed by the plurality of leads, the die pad including:
a first die pad surface disposed at the first package face, and
a second die pad surface opposite the first die pad surface, the semiconductor device is attached to a central region of the second die pad surface, and the second die pad surface extends outward from the die and is in contact with the molding compound, at least a portion of the second die pad surface in contact with the molding compound is roughened to improve adhesion between the molding compound and the die pad and a first plurality of grooves are disposed in the second die pad surface, each groove in the first plurality of grooves extending generally parallel to and offset from a respective die pad side surface and being positioned between the respective die pad side surface and the semiconductor device.

4. The semiconductor device package of claim 3, wherein the grooves have a depth relative to the second surface of between about 30% to about 70% of a profile height of the die pad.

5. The semiconductor device package of claim 3, wherein the die pad further includes:
a second plurality of grooves disposed in the second die pad surface, each groove in the second plurality of grooves extending from a groove in the first plurality of grooves to a respective die pad side surface.

6. A semiconductor device package comprising:
a molding compound forming at least a portion of:
a first package face,
a second package face opposite the first package face, and
package side faces extending between the first and second package faces;
a semiconductor device at least partially covered by the molding compound, the semiconductor device including a plurality of I/O pads; and
an electrically conductive lead frame comprising:
a plurality of leads disposed proximate a perimeter of the package, each lead having a first lead surface disposed at the first package face and a bond site to which at least one of the I/O pads is electrically connected, and
a die pad disposed in a central region formed by the plurality of leads, the die pad including:
a first die pad surface disposed at the first package face with at least one first groove disposed across the first die pad surface, the at least one first groove extending beneath the semiconductor device, and
a second die pad surface opposite the first die pad surface, the semiconductor device is attached to a central region of the second die pad surface, and the second die pad surface extends outward from the die and is in contact with the molding compound, at least a portion of the second die pad surface in contact with the molding compound is roughened to improve adhesion between the molding compound and the die pad.

7. The semiconductor device package of claim 6, wherein the at least one first groove has a depth relative to the first surface of between about 30% to about 70% of a profile height of the die pad.

8. The semiconductor device package of claim 7, wherein the die pad further includes:
a plurality of second grooves disposed in the first die pad surface, each second groove in the plurality of second grooves extending generally parallel to and offset from a respective die pad side surface.

9. The semiconductor device package of claim 8, wherein the die pad further includes:
at least one aperture disposed through the die pad, with the at least one aperture being positioned in at least one of the first and second grooves for receiving the molding compound.

10. A semiconductor device package comprising:
a molding compound forming at least a portion of:
a first package face,
a second package face opposite the first package face, and
package side faces extending between the first and second package faces;
a semiconductor device at least partially covered by the molding compound, the semiconductor device including a plurality of I/O pads; and
an electrically conductive lead frame comprising:
a plurality of leads disposed proximate a perimeter of the package, each lead having a first lead surface disposed at the first package face and a bond site to which at least one of the I/O pads is electrically connected,
a die pad disposed in a central region formed by the plurality of leads, the die pad including:
a first die pad surface disposed at the first package face, and
a second die pad surface opposite the first die pad surface, the semiconductor device is attached to a central region of the second die pad surface, and the second die pad surface extends outward from the die and is in contact with the molding compound, at least a portion of the second die pad surface in contact with the molding compound is roughened to improve adhesion between the molding compound and the die pad, and tie bars extending from the die pad.

11. A semiconductor device package comprising:
a molding compound forming at least a portion of:
a first package face,
a second package face opposite the first package face, and
package side faces extending between the first and second package faces;
a semiconductor device at least partially covered by the molding compound, the semiconductor device including a plurality of I/O pads; and
an electrically conductive lead frame comprising:
a plurality of leads disposed proximate a perimeter of the package, each lead having a first lead surface disposed at the first package face and a bond site to which at least one of the I/O pads is electrically connected, and a die pad disposed in a central region formed by the plurality of leads, the die pad including:
a first die pad surface disposed at the first package face,
a second die pad surface opposite the first die pad surface, the semiconductor device is attached to a central region of the second die pad surface, and the second die pad surface extends outward from the die and is in contact with the molding compound, at least a portion of the second die pad surface in contact with the molding compound is roughened to improve adhesion between the molding compound and the die pad, and
at least one lip extending from at least one of said first die pad side surface and said second die pad side surface.

12. A semiconductor device package comprising:
a molding compound forming at least a portion of:
a first package face,
a second package face opposite the first package face, and
package side faces extending between the first and second package faces;
a semiconductor device at least partially covered by the molding compound, the semiconductor device including a plurality of I/O pads; and
an electrically conductive lead frame comprising:
a plurality of leads disposed proximate a perimeter of the package, each lead having a first lead surface disposed at the first package face and a bond site to which at least one of the I/O pads is electrically connected, and
a die pad disposed in a central region formed by the plurality of leads, the die pad including:
a first die pad surface disposed at the first package face, and
a second die pad surface opposite the first die pad surface, the semiconductor device is attached to a central region of the second die pad surface, and the second die pad surface extends outward from the die and is in contact with the molding compound, at least a portion of the second die pad surface in contact with the molding compound is roughened to improve adhesion between the molding compound and the die pad with at least one aperture extending from the first side of the die pad to the second side of the die pad, the semiconductor device spanning the at least one aperture for facilitating the egress of moisture from the package.

13. A semiconductor device package comprising:
a molding compound forming at least a portion of:
a first package face,
a second package face opposite the first package face, and
package side faces extending between the first and second package faces;
a semiconductor device at least partially covered by the molding compound, the semiconductor device including a plurality of I/O pads; and
an electrically conductive lead frame comprising:
a plurality of leads disposed proximate a perimeter of the package, each lead having a first lead surface disposed at the first package face and a bond site to which at least one of the I/O pads is electrically connected, and
a die pad disposed in a central region formed by the plurality of leads, the die pad including:
a first die pad surface disposed at the first package face, and
a second die pad surface opposite the first die pad surface, the semiconductor device being attached to a central region of the second die pad surface, and a first plurality of grooves disposed in the second die pad surface, each groove in the first plurality of grooves extending generally parallel to and offset from a respective die pad side surface and being positioned between the respective die pad side surface and the semiconductor device, wherein the grooves have a depth relative to the second surface of between about 30% to about 70% of a profile height of the die pad.

14. The semiconductor device package of claim 13, wherein the die pad further includes:
a second plurality of grooves disposed in the second die pad surface, each groove in the second plurality of grooves extending from a groove in the first plurality of grooves to a respective die pad side surface.

15. A semiconductor device package comprising:
a molding compound forming at least a portion of:
a first package face,
a second package face opposite the first package face, and
package side faces extending between the first and second package faces;
a semiconductor device at least partially covered by the molding compound, the semiconductor device including a plurality of I/O pads; and
an electrically conductive lead frame comprising:
a plurality of leads disposed proximate a perimeter of the package, each lead having a first lead surface disposed at the first package face and a bond site to which at least one of the I/O pads is electrically connected, and
a die pad disposed in a central region formed by the plurality of leads, the die pad including:
a first die pad surface disposed at the first package face, and
a second die pad surface opposite the first die pad surface, the semiconductor device being attached to a central region of the second die pad surface, and
at least one first groove disposed across the first die pad surface and having a depth relative to the first surface of between about 30% to about 70% of a profile height of the die pad, each groove in the first plurality of grooves extending beneath the semiconductor device.

16. The semiconductor device package of claim 15, wherein the die pad further includes:
a plurality of second grooves disposed in the first die pad surface, each second groove in the plurality of second grooves extending generally parallel to and offset from a respective die pad side surface.

17. The semiconductor device package of claim 16, wherein the die pad further includes:
at least one aperture disposed through the die pad, with the at least one aperture being positioned in at least one of the first and second grooves for receiving the molding compound.

18. The semiconductor device package of claim 15, wherein the die pad further includes:
at least one aperture disposed through the die pad, with the at least one aperture being positioned in the at least one first groove for receiving the molding compound.

* * * * *